United States Patent [19]

Hansen

[11] Patent Number: 5,053,712

[45] Date of Patent: Oct. 1, 1991

[54] METHOD FOR COMPARING THE QUALITY OF RF ABSORBERS

[75] Inventor: Diethard Hansen, Berikon, Switzerland

[73] Assignee: Asea Brown Boveri LTD., Baden, Switzerland

[21] Appl. No.: 433,218

[22] Filed: Nov. 8, 1989

[30] Foreign Application Priority Data

Nov. 11, 1988 [DE] Fed. Rep. of Germany ....... 3838259

[51] Int. Cl.⁵ ...................... G01R 27/28; G01N 22/00
[52] U.S. Cl. .................... 324/627; 324/601; 324/606; 324/647; 333/81 A
[58] Field of Search ............... 324/627, 601, 606, 627, 324/638, 639, 637, 642, 645, 646, 647; 333/81 A, 81 R, 22 R, 24 S; 342/1

[56] References Cited

U.S. PATENT DOCUMENTS

| 2,594,971 | 4/1952 | Moullin ................................. 342/1 |
| 3,778,837 | 12/1973 | Hardy ................................. 342/1 X |
| 4,003,840 | 1/1977 | Ishino et al. ....................... 342/1 X |
| 4,281,284 | 7/1981 | Stutz et al. .......................... 324/627 |

FOREIGN PATENT DOCUMENTS

| 0246544 | 11/1987 | European Pat. Off. . |
| 1131284 | 6/1962 | Fed. Rep. of Germany . |
| 1293344 | 4/1969 | Fed. Rep. of Germany . |
| 2164322 | 6/1973 | Fed. Rep. of Germany . |
| 2135587 | 1/1976 | Fed. Rep. of Germany . |
| 3731165 | 3/1989 | Fed. Rep. of Germany . |

OTHER PUBLICATIONS

Emerson et al., "Broadband Absorbing Materials", *Tel-Tech & Electronic Industries*, (Nov. 1955) pp. 74-75.

Newman, "Radiation Absorbers-Their Selection and Use", *Electronic Design* (Feb. 1957).

Meyer, "Experiments on CM Waves in Analogy with Acoustic Techniques Made in Göttingen", *Journal of the Acoustical Society of America*, vol. 30, No. 7 (Jul. 1958) pp. 624-632.

Die Kurzinformation 14, 12/1965, p. 19, Neues von Rohde & Schwarz, "Reflexion Absorbierender Flachen Im Freien Raum".

Mikrowellen Magazine, vol. 13, No. 6, 12/1987, pp. 701-703, H. Seemann, et al., "Firmenportrait".

Electronics Letters, vol. 23, No. 5, Feb. 26, 1987, pp. 184-185, A. Kumar, "Acetylene Black: A Single-Layer Microwave Absorber".

IEEE Transactions on Electromagnetic Compatibility, vol. EMC-24, No. 3, Aug. 1982, pp. 356-358, R. G. Fitz Gerrell, "Using Free-Space Transmission Loss for Evaluating Anechoic Chamber Performance".

Electronics and Communications in Japan, vol. 62-B, No. 5, 12/1979, pp. 67-75, M. Ono, et al., "Measurement of Oblique-Incidence Characteristics of Absorbers by Standing Wave Technique".

IEEE 1988 International Symposium on EMC, Seattle, U.S.A., Aug. 2-4, 12/1988, pp. 1-7, D. Hansen, et al., "An Investigation into the Scattering and Radiation Characteristic of RF-Absorbers".

*Primary Examiner*—Kenneth Wieder
*Assistant Examiner*—Robert W. Mueller
*Attorney, Agent, or Firm*—Oblon, Spivak, McClelland; Maier & Neustadt

[57] ABSTRACT

A method for comparing the quality of RF absorbers uses a TEM cell which is provided with a low-reflection termination, in which cell the absorber wall (5) is equipped with reference absorbers (13). A steep-edged pulse wave is radiated in by means of a pulse generator (9) and a scattered wave reflected by the test absorber (14) is detected by means of a sensor (10). A reflection of the absorber wall is then determined by means of a first calibration measurement. The reference absorber is removed in a test area and a reflection of a metal wall (8) lying behind it is then determined by means of a second calibration measurement. Finally, a reflection of the test absorber (14) arranged in the test area is determined in a comparison measurement.

10 Claims, 2 Drawing Sheets

METHOD FOR COMPARING THE QUALITY OF RF ABSORBERS

BACKGROUND OF THE INVENTION

1. Field of the Invention

The invention relates to a method for comparing the quality of RF absorbers, in which a test absorber in a TEM cell which is provided with an absorber wall of reference absorbers, is irradiated with a steep-edged pulse wave and a scattered wave reflected from the test absorber is detected by means of a sensor.

2. Discussion of Background

Radio-frequency absorbers are very important in connection with EMI control. These absorbers are used, in particular, for creating anechoic test rooms.

To determine the properties of RF absorbers, mainly two methods are used, namely the arch method and the waveguide method. Both have the basic disadvantage that they are restricted to high frequencies (from approximately 100 MHz). In the arch method, the limitation is given by the size of the antenna and in the waveguide method it is given by the cut-off condition of the mode conducted or, respectively, the transverse dimension of the waveguide.

From the publication "An Investigation into the Scattering and Radiation Characteristics of RF-Absorbers", D. Hansen, N. Ari, H. Garbe, IEEE 1988 International Symposium on EMC, Seattle, USA, Aug. 2-4, 1988, a device is known by means of which the frequency response of RF absorbers can also be measured below 100 MHz. In this arrangement, a test absorber to be measured is introduced into a TEM cell used as test cell. This alone results in enormous advantages compared with the two usual methods. However, investigations have shown that the most recently known method does not fully exhaust the possibilities of the TEM cell.

SUMMARY OF THE INVENTION

Accordingly, one object of this invention is to optimize a method of the type initially mentioned.

According to the invention, the solution consists in that in such a method,
- a) a first calibration measurement is performed in which a reflection of the absorber wall is determined,
- b) a second calibration measurement is performed in which the reference absorbers are removed in a test area of the absorber wall and a reflection of a metal wall lying behind it is determined,
- c) a comparison measurement is performed in which a reflection of the test absorber arranged in the test area is determined, and
- d) that the TEM cell is provided with a low-reflection line termination.

According to a preferred embodiment of the invention, the test area is in the vicinity of a center of a longitudinal side of the rectangular absorber wall. In this arrangement, the sensor is arranged at a distance D from the front face, the distance D corresponding to about one third of a total length of the TEM cell.

It is also the object of the invention to create a corresponding device for carrying out comparisons of quality.

The device according to the invention is distinguished
- a) by a TEM cell in which a TEM wave is conducted by an inner conductor and an outer conductor and is absorbed at one end of the TEM cell by an absorber wall for the absorption of a field-guided energy and by an ohmic line termination for absorbing a conductor-bound energy of the TEM wave;
- b) by the low amount of reflection of the line termination which is achieved by the fact that the line termination is located in a plane determined by the inner conductor and located in the wave direction, the line termination is designed as an ohmic resistance which produces a gradual serial attenuation in the inner conductor and locally compensates a capacitance loading additionally caused on the line termination by the RF absorber;
- c) by a pulse generator for generating steep-edged pulse waves;
- d) by a sensor which is arranged in front of the absorber wall at a distance D of about one third of a total length of the TEM cell; and
- e) by a test absorber which is arranged in a test area of the absorber wall instead of the reference absorbers.

The invention has the following essential advantages:
1. A qualitatively good TEM wave is radiated onto the test object since the TEM wave is not disturbed in its propagation before it arrives at the absorber wall.
2. There are no diffraction phenomena at the test object.
3. There is no complicated position-dependence of the measurement as in the waveguide method.
4. The properties of the RF absorbers can be investigated in detail since the reflected field wave is measured directly and it is not an indirect quantity which is measured as in the case of a VSWR measurement.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
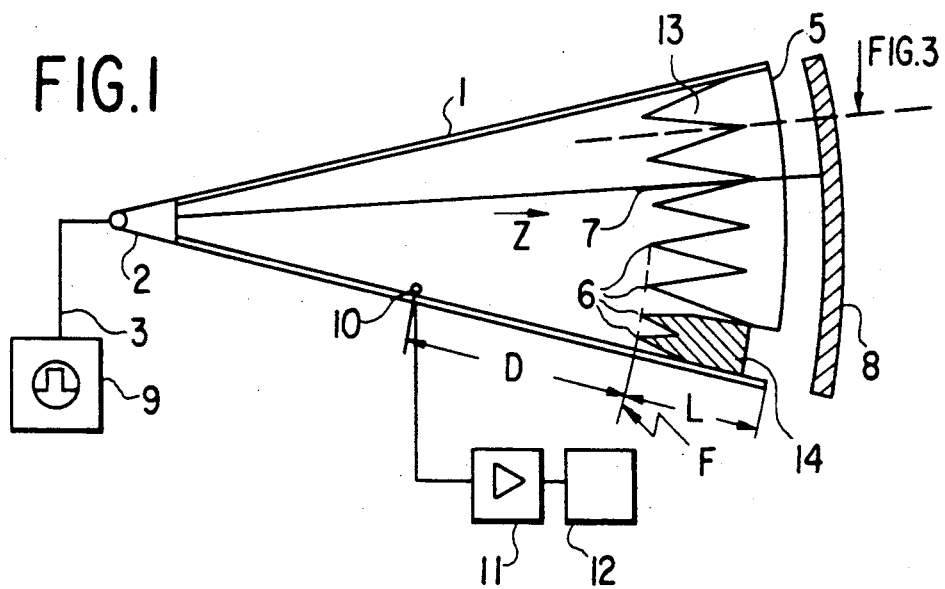
FIG. 1 shows a device for carrying out a comparison of the quality of RF absorbers.

Referring now to the drawings wherein like reference numerals designate identical or corresponding parts throughout the several views, FIG. 1 shows the essential parts of a device according to the invention. It comprises a TEM cell with an outer conductor 1, an asymmetric inner conductor 4, a feed wedge 2 and an absorber wall 5. A coaxial cable 3 supplies a pulse-shaped radio-frequency (RF) generated by a pulse generator 9 to the feed wedge 2 which generates a TEM wave (TEM = transverse electromagnetic) and couples it into the TEM cell.

The TEM cell expands in the form of a pyramid from a point. The absorber wall 5 is located at the widened end of the TEM cell and has the form of a spherical cap. It is provided, for example, with absorber points 6 and is adapted to the required wave field propagating in the TEM cell. That is to say, it absorbs the field-guided proportion of the energy of the TEM wave. The absorber points 6 define a smooth front face F. Behind the absorber wall 5, a metal wall 8 is located.

A sensor 10 is arranged in the TEM cell, preferably at the outer conductor 1, at a distance D in front of the front face F, the distance D corresponding to approximately one third of a total length of the TEM cell. A scattered wave detected by the sensor 10 is evaluated by an amplifier 11 and a detector 12 (oscilloscope, digitizer).

The absorber wall 5 consists of reference absorbers 13 of a given length L. The reference absorbers 13 are replaced by test absorbers 14 in a test area of the absorber wall 5. These test absorbers are no larger than the reference absorbers 13. The test area is located in the lower part (that is to say in the greater part of the TEM cell which is asymmetrically subdivided by the inner conductor 4) in the center.

Figure 2:
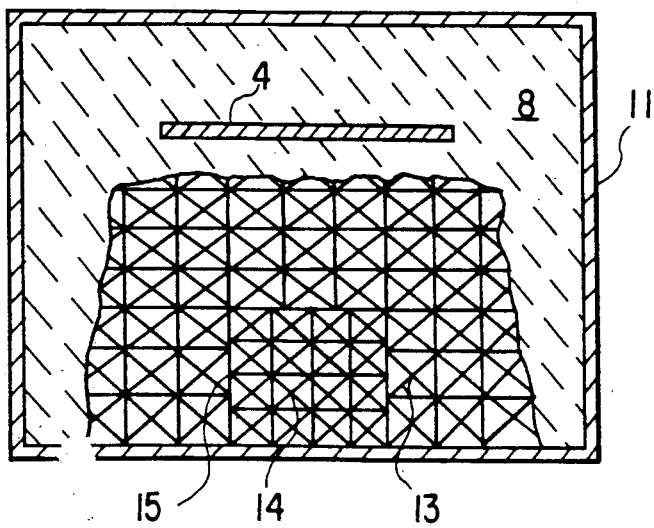
FIG. 2 shows a front view of the absorber wall.

FIG. 2 shows a front view of the absorber wall, that is to say as seen from the feed wedge. It is known that the outer conductor 1 and correspondingly also the absorber wall 5 have an essentially rectangular cross-section with which longitudinal sides and broad sides are appropriately associated. The inner conductor 4 subdivides this cross-section parallel to its longitudinal side into a small upper and a large lower area. The reference absorbers 13 are replaced by test absorbers 14 in a test area 15, the absorber points 6 forming a common front face F overall. The test area 15 is located at a longitudinal side of the rectangular absorber wall 5, approximately in the center of this longitudinal side.

The distance D between sensor 10 and front face F is basically dimensioned in accordance with the solid angle assumed by the test absorber 14 with respect to the sensor 10. The distance D is advantageously 0.5 to 1 m. The test area corresponds, for example, to about one tenth of the area of the rectangular cross-section.

The TEM cell as such is described in detail in U.S. Pat. No. 4,837,581, the content of which is herewith included in the present application.

The inner conductor 1 is plate-shaped and is provided with a line termination 7 at the wide end of the TEM cell 1. This line termination 7 is designed in such a manner that the conductor-bound proportion of the energy of the TEM wave is absorbed. Such a line termination cannot produce any interference and, at the same time, interference modes produced for other reasons are attenuated. In the following text, the essential points to be observed in order to maintain the low amount of reflection will be discussed.

Firstly, the line termination 7 must be geometrically arranged in such a manner that it is located in a plane determined by the inner conductor 4. Thus it represents a planar continuation of the inner conductor 4 in the direction of the wave field. (In FIG. 1, an arrow designated by z indicates the direction of the wave field). A current flowing in the inner conductor 4 is thus conducted away without discontinuity. Due to the fact that the current propagation in the wave direction is not disturbed, no unwanted modes are produced.

Secondly, the line termination 7 must be designed as an ohmic resistance which produces a gradual serial attenuation in the inner conductor 4. This will be explained with reference to FIG. 3.

Figure 3:
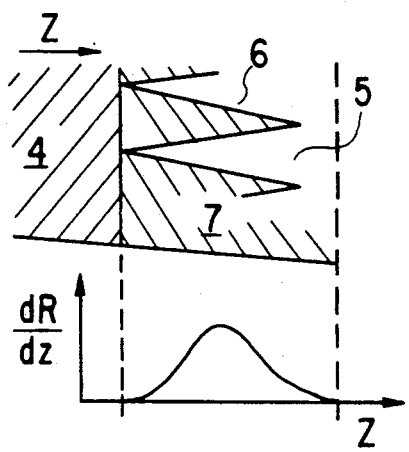
FIG. 3 shows a low-reflection line termination.

FIG. 3 shows how the low-reflection line termination 7 terminates the inner conductor 4. The absorber wall 5 with the absorber points 6 are indicated. The line termination 7 is formed in the entire area of the absorber wall 6. It is planar and has in the direction of propagation of the wave field a resistance characteristic $dR/dz$ which locally compensates the capacitance loading additionally caused on the line termination 7 by the absorber wall 5. Thus, the TEM wave "sees" the locally matched characteristic impedance at every point.

In the general case, the resistance characteristic $dR/dz$ rises from a small value at the inner conductor/line termination transition to a maximum and then drops back to a small value towards the end of the end area.

It is advantageous if the line termination, at the same time, exhibits a resistance characteristic which matches the current distribution transversely to the direction of propagation of the TEM wave.

Finally, the line termination 7 is designed in such a manner that a capacitance loading additionally caused on the inner conductor 4 by the absorber wall 5 and the absorber points 6 is locally compensated.

This line termination 7 can be advantageously implemented in such a manner that a support plate, for example a plywood plate, is provided with a resistance layer, for example graphite coating with a suitable position-dependent thickness.

The method according to the invention proceeds as follows.

Figure 4A:
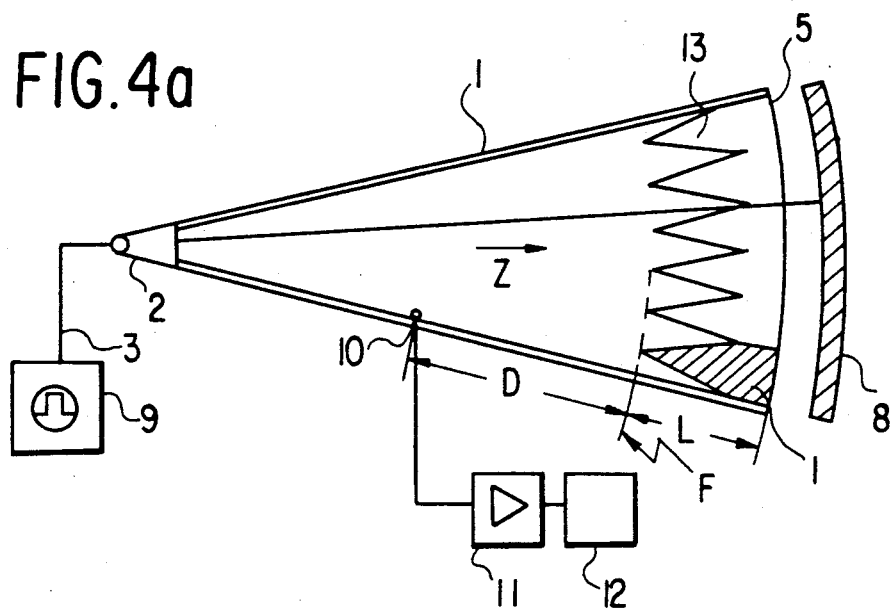
FIGS. 4a-4c are sequential illustrations of the method of the invention employed in the device shown in FIG. 1.

1. A first calibration measurement is performed shown in FIG. 4a. During this measurement, the entire absorber wall is equipped with reference absorbers, that is to say also in the test area. A steep-edged pulse wave is radiated in and the scattered wave produced by imperfections is detected. (Due to the low-reflection termination, the resultant signal will be close to the detection threshold of the measuring instruments).

Figure 4B:
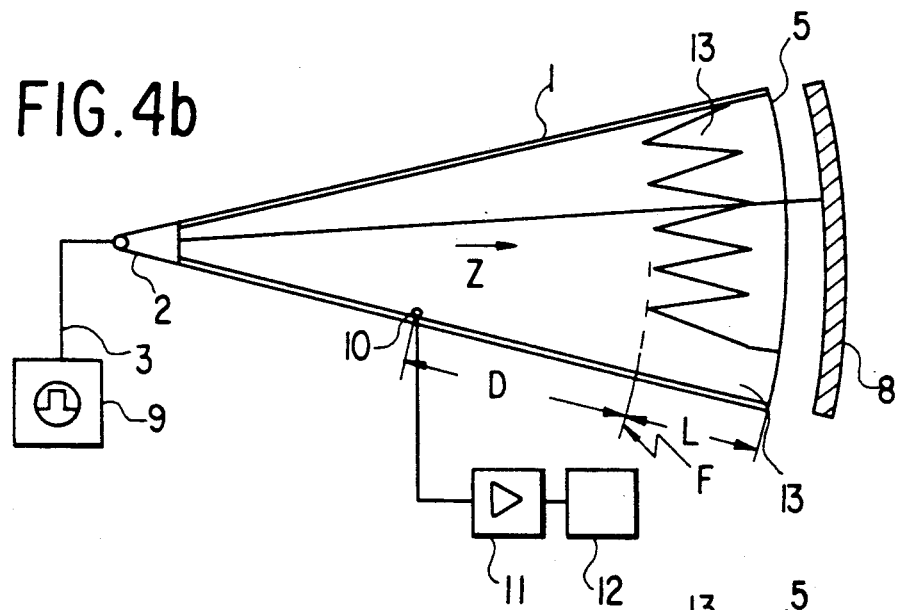

2. A second calibration measurement is performed as shown in FIG. 4b. During this measurement, the reference absorbers are removed in the test area so that the metal wall lying behind them appears. A steep-edged pulse wave is radiated in and the scattered wave generated by the metal wall is detected.

Figure 4C:
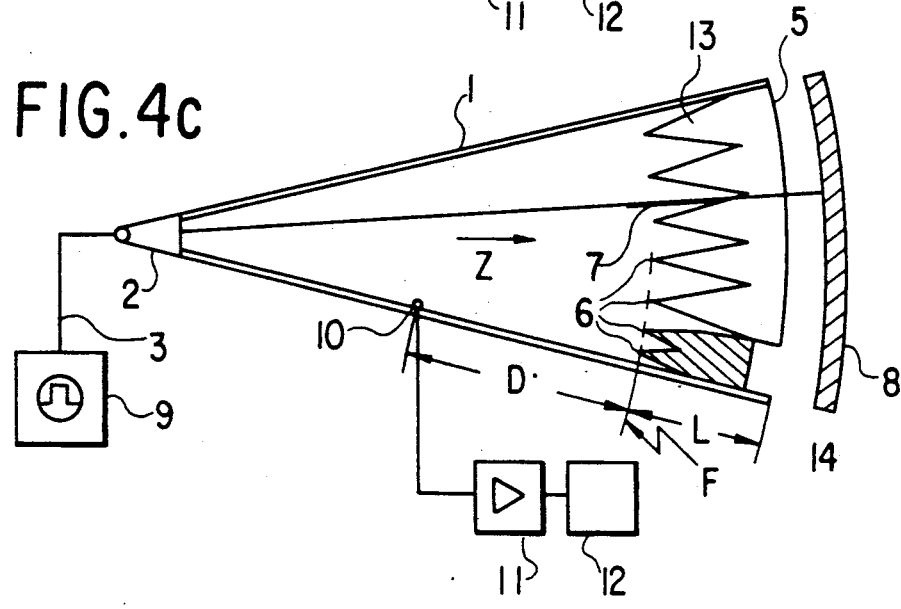

3. A reference measurement is performed as shown in FIG. 4c. During this measurement, the test absorbers are arranged in the test area. A steep-edged pulse wave is again radiated in and the scattered wave originating from the test absorbers is detected.

The metal wall represents the poorest test absorber possible, since it does not absorb the pulse wave at all. On the other hand, the absorber wall consisting only of reference absorbers (test area also equipped with reference absorbers) offers the best possible absorption. The quality of the test absorbers is determined by comparing the three scattered-field values measured. The ratio between back scatter and absorption of the TEM wave just arriving can be determined from this both experimentally and analytically.

For example, the frequency response of the test absorber can be calculated from the measured scattered wave with the aid of the fast Fourier transformation, called FFT for short. It should be pointed out again at this point that this can be carried out separately for the E field and for the H field with the invention. Accordingly, the test absorber can be investigated in much greater detail than with the prior art.

The steeper the edge of the pulse wave, the greater the local resolution of the measurement. A pulse wave of, for example, 5 ns pulse duration and a few 100 ps rise time supplies good measurement results. Naturally, the invention is not restricted to this numerical example.

In principle, the better of two absorber types to be compared should always be used as reference absorber. In practice, this means that the test absorber is not larger than the reference absorber.

In conclusion, it can be said that the invention creates a method for comparing the quality of RF absorbers which not only enables measurements of highest quality to be performed in a wide frequency range but also detects the effectively relevant values which are necessary for evaluating RF absorbers.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A method for comparing the quality of RF absorbers by means of a TEM cell, wherein
   the TEM cell expands in the form of a pyramid from a point,
   an absorber wall is located at the widened end of the TEM cell and has the form of a spherical cap,
   a metal wall is located behind the absorber well,
   the TEM cell is provided with a low-reflection line termination,
   means for generating TEM pulses and
   means for evaluating a scattered wave are provided; comprising the steps of
   performing a first calibration measurement wherein the reflection of the absorber wall entirely equipped with reference absorbers is determined;
   performing a second calibration measurement wherein the reference absorbers are removed in a test area of the absorber wall such that the reflection of the metal wall lying behind the absorber wall is determined in said test area;
   performing a third measurement wherein the test absorbers are arranged in the place of the test area such that the reflection of the absorber wall with the test absorbers arranged in the test area is determined; and
   determining the quality of the test absorbers based on a predetermined comparison of results of the first, second and third measurements performed.

2. The method as claimed in claim 1, wherein the test absorber is not longer than the reference absorbers.

3. The method as claimed in claim 1, wherein the test absorber is aligned with respect to the reference absorbers in such a manner that the test absorbers (14) and reference form a common front face (F).

4. The method as claimed in claim 1, wherein
   (a) the test area is arranged in the vicinity of a center of a longitudinal side of the rectangular absorber wall, and
   (b) the sensor is arranged at a distance D from the front face (F), the distance D corresponding to about one third of a total length of the TEM cell.

5. The method as claimed in claim 4, wherein the distance D is about 0.5 to 1 m.

6. A device for carrying out a comparison of the quality of RF absorbers, comprising:
   (a) a TEM cell in which a TEM wave is conducted by an inner conductor and an outer conductor and is absorbed at one end of the TEM cell by an absorber wall for absorbing a field-guided energy and by an ohmic line termination for absorbing a conductor-bound energy of the TEM wave;
   (b) the termination located in a place determined by the inner conductor and located in the wave direction, the line termination designed as an ohmic resistance which produces a gradual serial attenuation in the inner conductor and locally compensates a capacitance loading additionally caused on the line termination by the RF absorber;
   (c) a pulse generator for generating steep-edged pulse waves;
   (d) a sensor which is arranged in front of the absorber wall at a distance D of about one third of a total length of the TEM cell;
   (e) means for producing a first signal based on a detection by the sensor during a first calibration measurement wherein the reflection of the absorber wall entirely equipped with reference absorbers is determined;
   (f) means for producing a second signal based on a detection by the sensor during a second calibration measurement wherein the reference absorbers are removed in a test area of the absorber wall such that the reflection of the absorber wall outside the test area and the metal wall lying behind the absorber wall is determined;
   (g) means for producing a third signal based on a detection by the sensor during a third measurement wherein test absorbers are arranged in the place of the test area such that the reflection of the absorber wall with the test absorbers arranged in the test area is determined; and
   (h) means for determining the quality of the test absorbers based on a predetermined comparison of the first, second and third signals.

7. The device as claimed in claim 6, wherein the test absorber is not larger than the reference absorber.

8. The device as claimed in claim 6, wherein the test absorber is aligned with respect to the reference absorbers in such a manner that test absorbers and reference absorbers form a common front face (F).

9. The device as claimed in claim 6, wherein the distance D is about 0.5 to 1 m.

10. The device as claimed in claim 6, wherein the test area is located in the vicinity of a center of a longitudinal side of the rectangular absorber wall.

* * * * *